United States Patent
Horng et al.

(10) Patent No.: US 9,276,548 B2
(45) Date of Patent: Mar. 1, 2016

(54) STACKED LC RESONATOR AND BAND PASS FILTER USING THE SAME

(71) Applicant: NATIONAL SUN YAT-SEN UNIVERSITY, Kaohsiung (TW)

(72) Inventors: Tzyy-Sheng Horng, Kaohsiung (TW); Chien-Hsun Chen, Kaohsiung (TW); Chien-Hsiang Huang, Kaohsiung (TW); Sung-Mao Wu, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 248 days.

(21) Appl. No.: 13/675,497

(22) Filed: Nov. 13, 2012

(65) Prior Publication Data

US 2013/0300520 A1   Nov. 14, 2013

(30) Foreign Application Priority Data

May 11, 2012   (TW) .............................. 101116936 A

(51) Int. Cl.
*H03H 7/01*   (2006.01)
*H03H 5/02*   (2006.01)
*H01P 7/08*   (2006.01)
*H03H 1/00*   (2006.01)

(52) U.S. Cl.
CPC ............... *H03H 7/0123* (2013.01); *H03H 5/02* (2013.01); *H01P 7/08* (2013.01); *H03H 2001/0085* (2013.01)

(58) Field of Classification Search
CPC ......... H03H 5/02; H03H 7/0123; H03H 7/08; H03H 2001/0085
USPC ................... 333/174, 175, 185, 219; 336/200
See application file for complete search history.

(56) References Cited

U.S. PATENT DOCUMENTS

2009/0160582 A1 * 6/2009 Fukamachi et al. .......... 333/204
2010/0265009 A1   10/2010 Horng et al.

FOREIGN PATENT DOCUMENTS

| EP | 2065966 | 3/2009 |
|---|---|---|
| TW | 523224 | 3/2003 |
| TW | 200947798 | 11/2009 |
| TW | 201029255 | 8/2010 |
| TW | I350610 | 10/2011 |

* cited by examiner

*Primary Examiner* — Benny Lee
*Assistant Examiner* — Jorge Salazar, Jr.
(74) *Attorney, Agent, or Firm* — Muncy, Geissler, Olds & Lowe, P.C.

(57) ABSTRACT

Provided are a stacked LC resonator and a band pass filter using the same. The stacked LC resonator includes a flat metal base layer; a plurality of spiral inductors disposed layer by layer, corresponding to the flat metal base layer; and a plurality of dielectric layers, formed between the spiral inductors, and between the flat metal base layer and the spiral inductor corresponding to the flat metal base layer. The band pass filter includes two resonators with symmetrical structures, wherein the spiral inductors of the two resonators are disposed corresponding to each other.

9 Claims, 7 Drawing Sheets

STACKED LC RESONATOR AND BAND PASS FILTER USING THE SAME

CROSS-REFERENCE TO RELATED APPLICATION

This application claims the benefit of Taiwan Patent Application No. 101116936, filed on May 11, 2012, which is hereby incorporated by reference for all purposes as if fully set forth herein.

BACKGROUND

1. Field of the Invention

The present invention relates to a stacked LC resonator and band pass filter using the same and more particularly to a resonator with stacked LC structure, and a band pass filter using the same.

2. Related Art

The composite design of traditional coupling filters generally employs the microstrip structure. In order to allow the microstrip to form serial or parallel combinations of resonators with equivalent, the microstrip structure with half-wave length or quarter-wave length resonant frequency should be used to achieve the resonance effect of resonator. However, the microstrip structure with half-wave length or quarter-wave length resonant frequency takes up large space. Besides the equivalent microstrip resonator structure, discrete component may also be used to design resonator. This discrete structure needs to employ actual inductors and capacitors serially connected to each other to allow resonance effect; hence, too many inductors and capacitors may also take up large space, making it difficult to achieve miniaturization of the resonator.

SUMMARY

In order to overcome the deficiencies of the prior art, an objective of the present invention is to provide a stacked LC resonator and band pass filter using the same.

According to the present invention, the stacked LC resonator disclosed therein includes a flat metal base layer, a plurality of spiral inductors, and a plurality of dielectric layers. The spiral inductors are disposed layer by layer, corresponding to the flat metal base layer. The dielectric layers are formed between the spiral inductors and between the flat metal base layer and the spiral inductor corresponding to the flat metal base layer.

According to the stacked LC resonator disclosed in the present invention, spirals of the spiral inductors are oriented in same, different, or partially-same, partially different directions.

According to the stacked LC resonator disclosed in the present invention further comprises N conductive poles, wherein the quantity of the plurality of spiral inductors is N for N>1, and the Nth conductive pole is connected between the second end of the (N−1)th spiral inductor and the first end of the Nth spiral inductor. Moreover, the quantity of the plurality of spiral inductors is N for N>1, and the second end of the Nth spiral inductor is open-ended.

The band pass filter according to the present invention includes a flat metal base layer, a plurality of coupled spiral inductors and a plurality of coupled dielectric layers. The coupled spiral inductors are disposed layer by layer, corresponding to the flat metal base layer. Further, the coupled dielectric layers are formed between each of the coupled spiral inductors, and between the flat metal base layer and the coupled spiral inductor corresponding to the flat metal base layer. Each of the plurality of coupled spiral inductor pairs comprises two spiral inductors that are disposed correspondingly to each other.

According to the band pass filter disclosed in the present invention, the intervals between each pair of the corresponding first spiral inductors and second spiral inductors are same width, different widths, or partially-identical, partially-different widths.

The band pass filter according to the present invention can be regarded as the coupled structure of the two stacked LC resonators, wherein each of the stacked LC resonator has N spiral inductors and N conductive poles for N>1, and the Nth conductive pole is connected between the second end of the (N−1)th spiral inductor of the each of the two stacked LC resonators and the first end of the Nth spiral inductor of the each of the two stacked LC resonators, and the second end of the Nth spiral inductor of the each of the two stacked LC resonators is open-ended.

The advantage of the present invention is in that the resonator disclosed in the present invention is consisted of a plurality of inductors, wherein each inductor is formed to have a spiral shape. Hence, it is possible to arrange metal wiring with the most appropriate length within a minimum area. Further, instead of using capacitors formed by actual components, the present invention satisfies the capacitance which the resonance frequency of the filter requires by forming parasitic capacitance formed by wiring structure (of same metal or different metals) of inductor. Therefore, the present invention may reduce the space taken up by actual components to achieve the goal of miniaturization of the resonator and the filter, while also lowering the manufacturing cost, and making the manufacturing process thereof simpler. Moreover, the resonator and the filter disclosed by the present invention may be manufactured using existing manufacturing process such as multi-layer circuit board and metal wiring arrangement without having to additionally purchase any other manufacturing equipment or altering any current manufacturing equipment or device; this may reduce the cost spent on the manufacturing equipment, and enhance the applicability of the manufacturing equipment.

DETAILED DESCRIPTION

Now, the preferred embodiment of the present invention will be described in detail with reference to the accompanying drawings.

Figure 1:
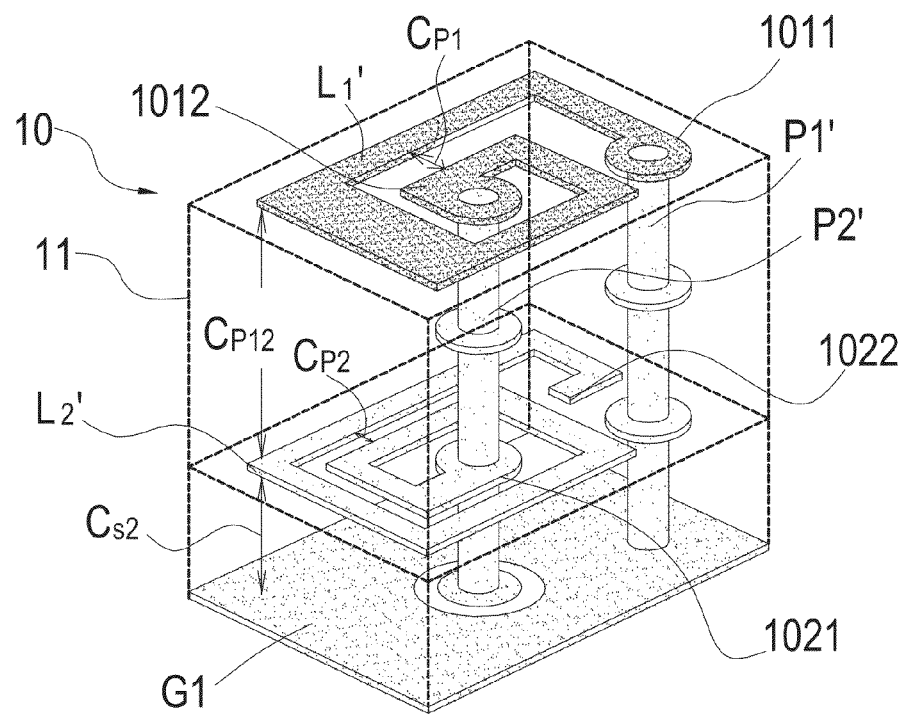
FIG. 1 is a structural view illustrating a first stacked LC resonator according to an embodiment of the present invention.
Figure 2:
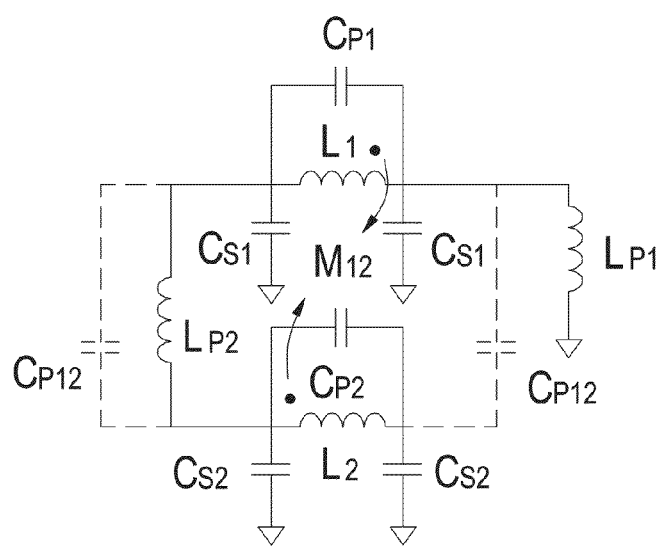
FIG. 2 is a view illustrating an equivalent circuit of the first stacked LC resonator according to the embodiment of the present invention.

Firstly, please refer to FIG. 1, which illustrates a structural view of a first stacked LC resonator according to an embodiment of the present invention, and FIG. 2, which illustrates an equivalent circuit of the first stacked LC resonator according to the embodiment of the present invention. Wherein, components illustrated in the structural view corresponding to components illustrated in the equivalent circuit view, only marking the components illustrated in the structural view with an additional mark: "'" to show the difference therebetween.

The stacked LC resonator 10 includes a flat metal base layer G1, a plurality of spiral inductors, and a plurality of dielectric layers 11. In the present embodiment, two spiral inductors are disposed, which are a first spiral inductor L1' and a second spiral inductor L2'.

The first spiral inductor L1' and the second spiral inductor L2' are disposed above the flat metal base layer G1. The first spiral inductor L1', the second spiral inductor L2', and the flat metal base layer G1 are disposed in a parallel manner. The dielectric layers 11 are disposed between the first spiral inductor L1' and the second spiral inductor L2', and between the second spiral inductor L2' and the flat metal base layer G1. There is no limit placed on the heights of the two dielectric layers 11; they may be determined according to the requirements of the design to be identical to each other or different from each other.

In the embodiment, the first spiral inductor L1' further includes a first end 1011 and a second end 1012. The second spiral inductor L2' further includes a first end 1021 and a second end 1022. The second end of the second spiral inductor is open-ended. The stacked LC resonator 10 includes a first conductive pole P1'. The first conductive pole P1' penetrates through each of the dielectric layers 11, and connects the first end 1011 of the first spiral inductor L1', and the flat metal base layer G1.

The stacked LC resonator 10 includes a second conductive pole P2'. The second conductive pole P2' penetrates through each of the dielectric layers 11, and connects the second end 1012 of the first spiral inductor L1' and the first end 1021 of the second spiral inductor L2'. The first conductive pole P1' and the second conductive pole P2' allow the first spiral inductor L1', the second spiral inductor L2', and the flat metal base layer G1 to be electrically connected to each other. The first conductive pole P1' and the second conductive pole P2' may be a hollow incorporating conductive component or a solid conductive material, are not limited thereto, and may be determined according to requirements of the design.

Please further refer to the equivalent circuit view shown in FIG. 2, the present embodiment will be described with reference to FIGS. 1 and 2. The first spiral inductor L1' and the second spiral inductor L2' are serially connected by the first conductive pole P1' and the second conductive pole P2' to form a miniaturized stacked LC resonator 10 with a dual-band resonance.

The first spiral inductor L1' is made of metal material. A parasitic capacitance Cp1 may be generated between the spiral-shaped metal wiring by using the metal material with capacity of charge storage and the dielectric layers 11 with capacity of isolation. Similarly, the second spiral inductor L2' may generate a parasitic capacitance Cp2. With the help of the two conductive poles P1' and P2', two parasitic capacitances Cs1 will be generated between the first spiral inductor L1' and the flat metal base layer G1, two parasitic capacitances Cp12 will be generated between the first spiral inductor L1' and the second spiral inductor L2', and two parasitic capacitances Cs2 will be generated between the second spiral inductor L2' and the flat metal base layer G1. In the equivalent circuit, the two conductive poles P1' and P2' are used as two inductors LP1 and LP2.

M12 represents a mutual inductance value between the first spiral inductor L1' and the second spiral inductor L2'. The mutual inductance value may be used to control a resonant frequency of the stacked LC resonator 10. Wherein, the spirals of each of the first spiral inductor L1' and the second spiral inductor L2' are oriented in same, different, or partially-same, partially different directions. Regardless of the spiral orientation, the spiral inductors are all arranged to achieve the goal of lowering the mutual inductance value M12 between the first spiral inductor L1' and the second spiral inductor L2' to a negative value, thereby reducing the layout area of the metal wiring.

Further, inductance values of the spiral inductors L1' and L2' and a capacitance value of a parasitic capacitor may be adjusted by using the length and the diameter of each section of the spiral inductors L1' and L2', an interval between the spiral inductors L1' and L2', an interval between the spiral inductors L1' and L2' and the flat metal base layer G1 thereby obtaining the required resonant frequency of the stacked LC resonator 10.

Hence, the resonant frequency of the required stacked LC resonator may be obtained using inductance value of any spiral inductor with the capacitance value of corresponding to the parasitic capacitor. After the inductance value of each spiral inductor and capacitance value of parasitic capacitor are all determined, relative parameters such as a band pass frequency and a coupling value corresponding to each spiral inductor may still be adjusted.

Such as, a first band pass frequency WD1 corresponding to the first spiral inductor L1' may be obtained through following calculation formula:

$$WD1 = \sqrt{\frac{1}{2(Cs2+Cp1)L1T}}$$

Such as, a second band pass frequency WD2 corresponding to the second spiral inductor L2' may be obtained through following calculation formula:

$$WD2 = \sqrt{\frac{1}{Cs2+Cp} \cdot \left(\frac{1}{L1T} + \frac{2}{L2-M12}\right)}$$

Wherein, L1T=L1+LP1+LP2; Cp=Cp1+Cp2+Cp12. LP1 and LP2 represents an equivalent inductance value of the first conductive pole P1' and the second conductive pole P2', respectively.

Further, when the first band pass frequency WD1 corresponding to the first spiral inductor L1' is determined, the second band pass frequency WD2 corresponding to the second spiral inductor L2' may still be adjusted using the mutual inductance value M12. Therefore, the design of the present invention has excellent degree of freedom. When comparing to the traditional microstrip resonator with half-wave length or quarter-wave length resonant frequency, or comparing to resonator combined with capacitor, the stacked LC resonator according to the present invention requires a smaller component arranging space area.

Figure 3:
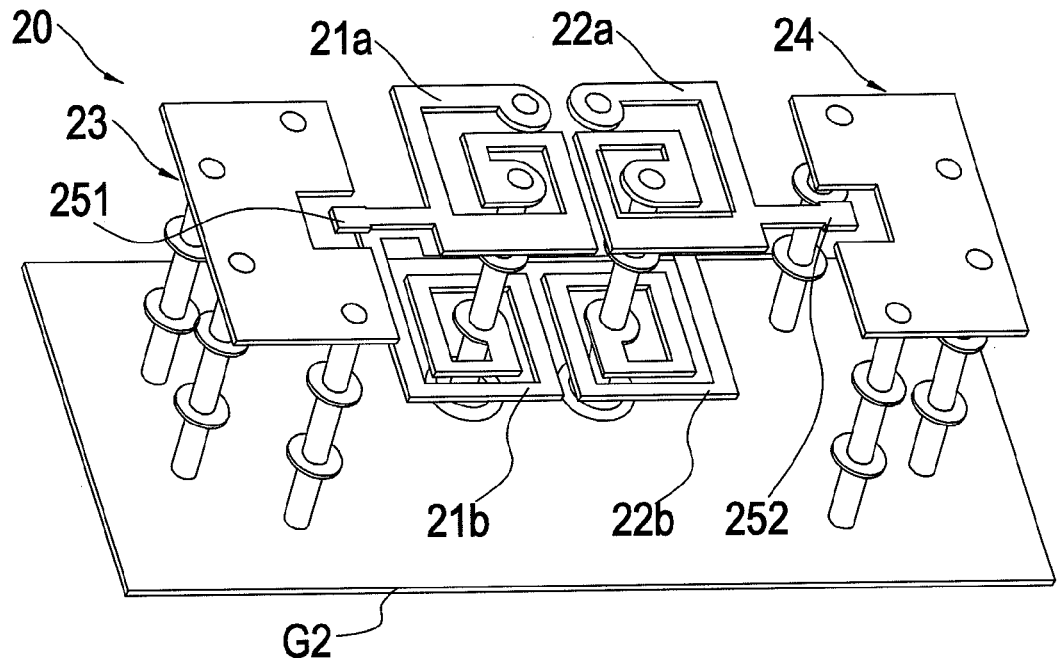
FIG. 3 is a structural view illustrating a dual-band band pass filter according to an embodiment of the present invention.

Please further refer to FIG. 3, which illustrates a structural view of a dual-band band pass filter according to an embodiment of the present invention. Please also refer to FIGS. 1 and 2 for better understanding. In the embodiment, two resonators as shown in FIG. 1 (with symmetrical structures) are arranged side-by-side to produce a coupling effect. As shown in FIG. 3, the dual-band band pass filter 20 includes a flat metal base layer G2, a plurality of first spiral inductors 21a and 21b, and a plurality of second spiral inductors 22a and 22b. Wherein, the structure of the first spiral inductor 21a and the second spiral inductor 22a is as the first spiral inductor L1' shown in FIG. 1; and the structure of the first spiral inductor 21b and the second spiral inductor 22b is as the second spiral inductor L2' shown in FIG. 1.

Each of the first spiral inductors 21a and 21b is disposed layer-by-layer and parallel to the flat metal base layer G2. A plurality of first dielectric layers (not shown) is formed between the first spiral inductors 21a and 21b, and between the flat metal base layer G2 and the first spiral inductor 21b corresponding to the flat metal base layer G2. Each of the second spiral inductors 22a and 22b is also disposed layer-by-layer and parallel to the flat metal base layer G2. A plurality of second dielectric layers (not shown) is formed between the second spiral inductors 22a and 22b, and between the flat metal base layer G2 and the second spiral inductor 22b corresponding to the flat metal base layer G2. In order to maintain clarity, the first and second dielectric layers are not illustrated in FIG. 3; please refer to FIG. 1 for the arrangement of the dielectric layers.

Wherein, each of the first spiral inductors 21a and 21b is disposed corresponding to each of the second spiral inductors 22a and 22b. Further, according to the requirements of the design, every pair of the corresponding first spiral inductors 21a and 21b and second spiral inductors 22a and 22b may have a same interval, different intervals, or partially different intervals therebetween.

Moreover, the resonator structure formed by the first spiral inductors 21a and 21b and the flat metal base layer G2 is seen as an input resonator, and the resonator structure formed by the second spiral inductors 22a and 22b and the flat metal base layer G2 is seen as an output resonator. The first spiral inductor 21a is connected to an input feed line 251, the second spiral inductors 22a is connected to an output feed line 252. An end of the input feed line 251 is disposed with an input part 23 for receiving signal, and an end of the output feed line 252 is disposed with an output part 24 for outputting signal. Wherein, an arrangement of the connecting part of the input feed line 251 and the first spiral inductor, an arrangement of the connecting part of the output feed line 252 and the second spiral inductors 22a, and an arrangement of the input part 23 and the output part 24 are all well known to one of ordinary skill in the art, hence detail description will be omitted herein.

Figure 4A:
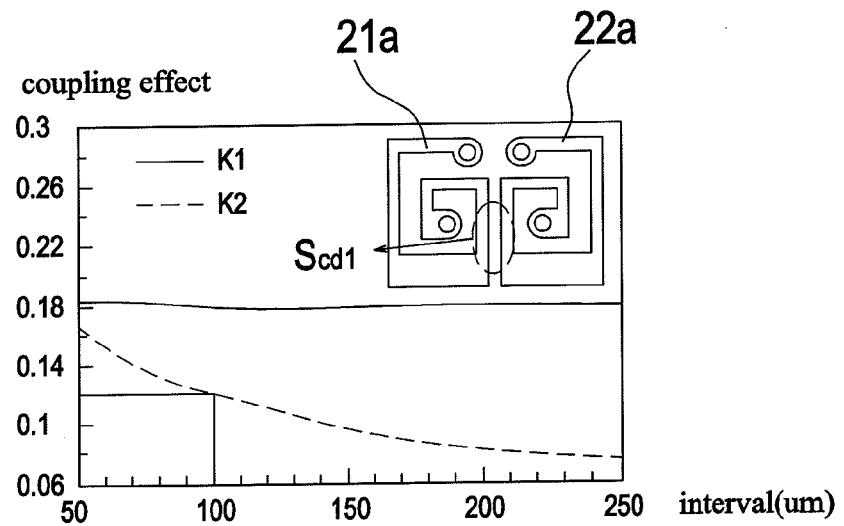
FIGS. 4A and 4B are views illustrating the embodiment of a coupling value curve of the dual-band band pass filter according to the present invention.
Figure 4B:
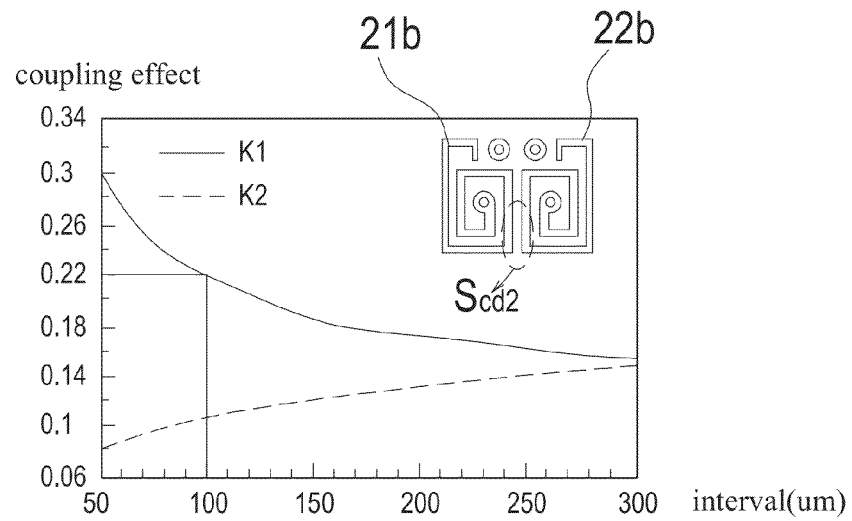

Please further refer to FIGS. 4A and 4B, which illustrate the embodiment of a coupling value curve of the dual-band band pass filter according to the present invention; and please also refer to FIG. 3 for better understanding.

Referring to the first spiral inductors 21a and 21b and the corresponding second spiral inductors 22a and 22b, when a transmitting signal, a coupling value of the corresponding electric field differs according to the interval between the first spiral inductors 21a and 21b and the second spiral inductors 22a and 22b (hereinafter, the corresponding first spiral inductors and second spiral inductors are referred to as a spiral inductor combination). Generally, at least one spiral inductor combination is influenced less by the electric field.

For example, no matter how a first interval Scd1 between the first spiral inductors 21a and the second spiral inductors 22a is adjusted, the coupling value k1 corresponding to this spiral inductor combination will not be affected. However, when a second interval Scd2 between the first spiral inductors 21b and the second spiral inductors 22b is adjusted, the coupling value k1 and the coupling value k2 corresponding to this spiral inductor combination will both be affected.

Assuming that the coupling value k1 that the dual-band band pass filter requires is 0.22, and the coupling value k2 that the dual-band band pass filter requires is 0.12. Firstly, the second interval Scd2 between the first spiral inductors 21b and the second spiral inductors 22b may be adjusted to be 100 um, thereby satisfying the requirement for making the coupling value k1 to be 0.22. And then, the first interval Scd1 between the first spiral inductors 21a and the second spiral inductors 22a is adjusted to be 100 um, hereby satisfying the requirement for making the coupling value k2 to be 0.12. The requiring coupling value of the dual-band band pass filter may hereby satisfies design requirement.

Figure 5:
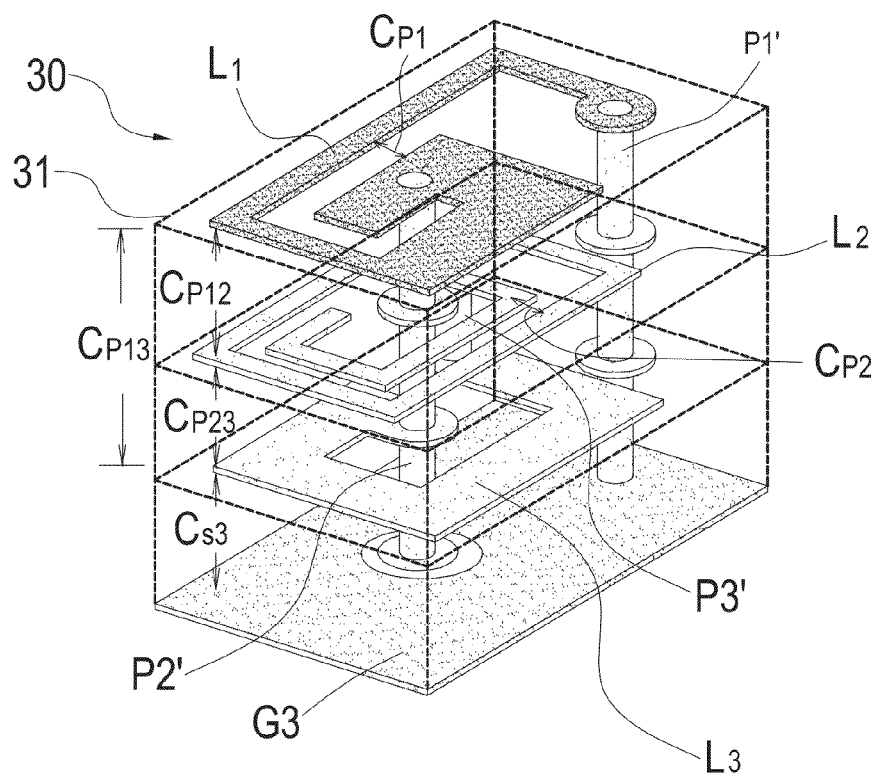
FIG. 5 is a structural view illustrating a second stacked LC resonator according to an embodiment of the present invention.
Figure 6:
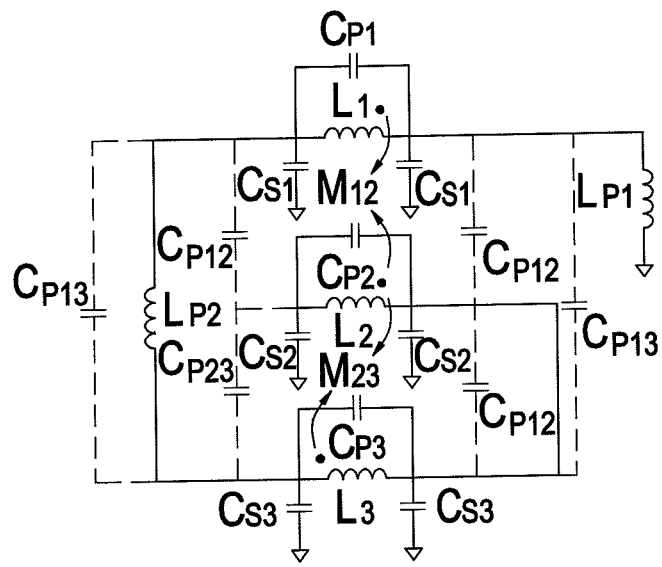
FIG. 6 is a view illustrating an equivalent circuit of the second stacked LC resonator according to the embodiment of the present invention.

Please refer to FIG. 5, which illustrates a second stacked LC resonator according to an embodiment of the present invention; and FIG. 6, which illustrates an equivalent circuit of the second stacked LC resonator according to an embodiment of the present invention. Wherein, components illustrated in the structural view corresponding to components illustrated in the equivalent circuit view, only marking the components illustrated in the structural view with an additional mark: "'" to show the difference therebetween. The stacked LC resonator 30 includes a flat metal base layer G3, a plurality of spiral inductors, and a plurality of dielectric layers 31. In the embodiment, three spiral inductors are disposed, which are a first spiral inductor L1', a second spiral inductor L2', and a third spiral inductor L3', wherein the second end of the third spiral inductor is open-ended.

As shown in FIG. 5, the first spiral inductor L1', the second spiral inductor L2', and the third spiral inductor L3' are disposed above the flat metal base layer G3. The first spiral inductor L1', the second spiral inductor L2', the third spiral inductor L3', and the flat metal base layer G3 are disposed in a parallel manner. The dielectric layers 31 are disposed between the first spiral inductor L1', the second spiral inductor L2', the third spiral inductor L3', and the flat metal base layer G3. There is no limit placed on the heights of the three dielectric layers 31; they may be determined according to design requirement to be identical to each other or different from each other.

In the embodiment, the stacked LC resonator 30 includes a first conductive pole P1', a second conductive pole P2', and a third conductive pole P3'. The first conductive pole P1', the second conductive pole P2' and the third conductive pole P3' may penetrate corresponding dielectric layers according to design requirement. Through the first conductive pole P1', the second conductive pole P2' and the third conductive pole P3', the first spiral inductor L1', the second spiral inductor L2', the third spiral inductor L3' and the flat metal base layer G3 may be electrically connected to each other. The first conductive pole P1', the second conductive pole P2' and the third conductive pole P3' may be a hollow incorporating conductive component or a solid conductive material, are not limited thereto, and may be determined according to design requirement.

The first spiral inductor L1', the second spiral inductor L2', the third spiral inductor L3' and the flat metal base layer G3 are serially connected by the first conductive pole P1', the second conductive pole P2' and the third conductive pole P3' to form a miniaturized stacked LC resonator 30 with a triple-band resonance.

The first spiral inductor L1' is made of metal material. Parasitic capacitance Cp1 may be generated between the spiral-shaped metal wiring by using the metal material with capacity of charge storage and the dielectric layers 31 with capacity of isolation. Similarly, the second spiral inductor L2' may generate parasitic capacitance Cp2, and the third spiral inductor L3' may generate a parasitic capacitance Cp3.

With the help of the conductive poles P1', P2' and P3', two parasitic capacitances Cs1 will be generated between the first spiral inductor L1' and the flat metal base layer G3, two parasitic capacitances Cp12 will be generated between the first spiral inductor L1' and the second spiral inductor L2', two parasitic capacitances Cp13 will be generated between the first spiral inductor L1' and the third spiral inductor L3', two parasitic capacitances Cs2 will be generated between the second spiral inductor L2' and the flat metal base layer G3, two parasitic capacitances Cp23 will be generated between the second spiral inductor L2' and the third spiral inductor L3', and two parasitic capacitances Cs3 will be generated between the third spiral inductor L3' and the flat metal base layer G3.

M12 represents the mutual inductance value between the first spiral inductor L1' and the second spiral inductor L2'. M23 represents the mutual inductance value between the second spiral inductor L2' and the third spiral inductor L3'. The two mutual inductance values may be used to control the resonant frequency of the stacked LC resonator 30. Wherein, spirals of each of the first spiral inductor L1', the second spiral inductor L2' and the third spiral inductor L3' are oriented in same, different, or partially-same, partially different directions. Regardless of the spiral orientation, the spiral inductors are all arranged to lower the mutual inductance value M12 between the first spiral inductor L1' and the second spiral inductor L2' and the mutual inductance value M23 between the second spiral inductor L2' and the third spiral inductor L3' to a negative value, thereby reducing the layout area of the metal wiring.

Further, inductance values of the spiral inductors and a capacitance value of the parasitic capacitor may be adjusted by using the length and the diameter of each section of the spiral inductors, thereby obtaining the required resonant frequency of the stacked LC resonator. Hence, the resonant frequency of the required stacked LC resonator 30 may be obtained using the inductance value of any spiral inductor with the capacitance value of corresponding parasitic capacitor. After the inductance value of each spiral inductor and the capacitance value of parasitic capacitor are all determined, relative parameters such as band pass frequency, coupling value and frequency matching value corresponding to each spiral inductor may still be adjusted.

Such as, a first band pass frequency WT1 corresponding to the first spiral inductor L1' may be obtained through following calculation formula:

$$WT1 = \sqrt{\frac{1}{2(Cs2 + Cp1)L1T}}$$

Such as, a second band pass frequency WT2 corresponding to the second spiral inductor L2' may be obtained through following calculation formula:

$$WT2 = \sqrt{\frac{1}{2(L2 - M12)} \cdot \left(\frac{1}{Cs3} + \frac{1}{Cp - 2Cp2}\right)}$$

Such as, a third band pass frequency WT3 corresponding to the third spiral inductor L3' may be obtained through following calculation formula:

$$WT3 = \sqrt{\frac{1}{2L1TCs3} + \frac{1}{Cs3(L3 - M23)} + \frac{2}{Cp(L2 - M12)}}$$

Wherein, L1T=L1+LP1+LP2; Cp=Cp1+Cp2+Cp12+Cp23. Further, when the first band pass frequency WT1 corresponding to the first spiral inductor L1' is determined, the second band pass frequency WT2 corresponding to the second spiral inductor L2' may still be adjusted using the mutual inductance value M12, and the third band pass frequency WT3 corresponding to the third spiral inductor L3' may also be adjusted using the mutual inductance value M23. Therefore, the design of the present invention has excellent degree of freedom. When comparing to the traditional microstrip resonator with half-wave length or quarter-wave length resonant frequency, or comparing to resonator combined with capacitor, the stacked LC resonator according to the present invention requires a smaller component arranging space area.

Figure 7:
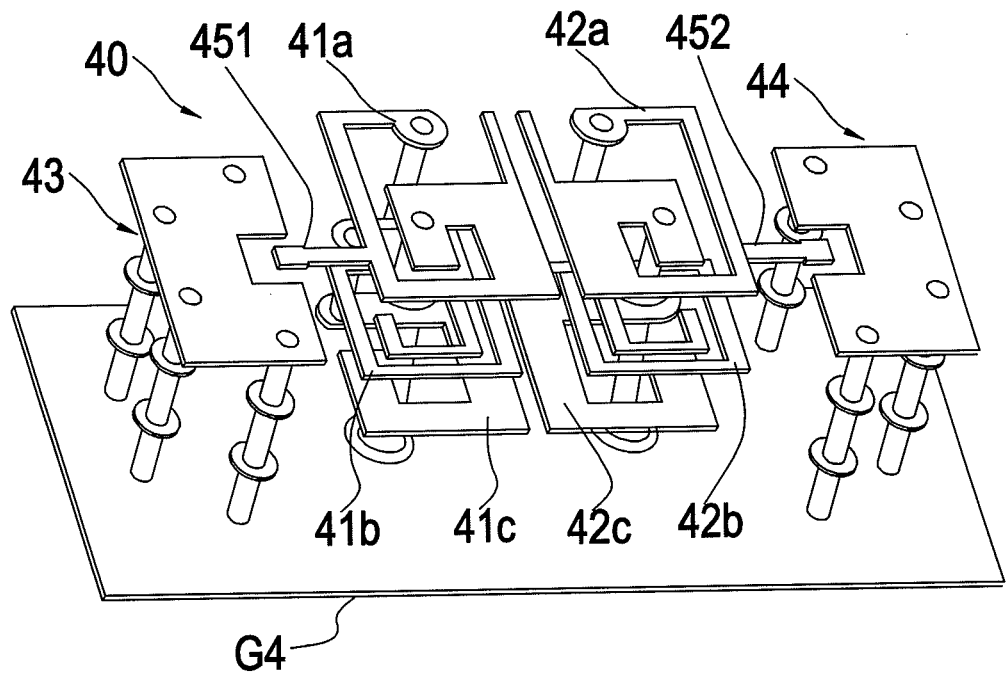
FIG. 7 is a structural view illustrating a triple-band band pass filter according to an embodiment of the present invention.

Please further refer to FIG. 7, which illustrates a structural view of a triple-band band pass filter according to an embodiment of the present invention; please also refer to FIGS. 5 and 6 for better understanding. In the embodiment, two resonators as shown in FIG. 5 (with symmetrical structures) are arranged side-by-side to produce coupling effect. Wherein, the triple-band band pass filter 40 includes an input part 43, an output part 44, an input feed line 451 and an output feed line 452; these components are identical or similar to the input part 23, the output part 24, the input feed line 251 and the output feed line 252 of the dual-band band pass filter 20, hence detailed description will be omitted herein.

The triple-band band pass filter 40 includes a flat metal base layer G4, a plurality of first spiral inductors, and a plurality of second spiral inductors. Comparing to the dual-band band pass filter 20 shown in FIG. 3, the embodiment includes: three first spiral inductors 41a, 41b and 41c; and three second spiral inductors 42a, 42b and 42c.

Wherein, the structure of the first spiral inductor 41a and the second spiral inductor 42a is as the first spiral inductor L1' shown in FIG. 5; the structure of the first spiral inductor 41b and the second spiral inductor 42b is as the second spiral inductor L2' shown in FIG. 5; and the structure of the third spiral inductor 41c and the third spiral inductor 42c is as the third spiral inductor L3' shown in FIG. 5.

Each of the first spiral inductors 41a, 41b and 41c is disposed layer-by-layer and parallel to the flat metal base layer G4. A plurality of first dielectric layers (not shown) is formed between the first spiral inductors 41a, 41b and 41c, and between the flat metal base layer G4 and the first spiral inductor 41c corresponding to the flat metal base layer G4. Each of the second spiral inductors 42a, 42b and 42c is also disposed layer-by-layer and parallel to the flat metal base layer G4. A plurality of second dielectric layers (not shown) is formed between the second spiral inductors 42a, 42b and 42c, and between the flat metal base layer G4 and the second spiral inductor 42c corresponding to the flat metal base layer G4. In order to maintain clarity, the first and second dielectric layers are not illustrated in FIG. 7; please refer to FIG. 5 for the arrangement of the dielectric layers.

Wherein, each of the first spiral inductors 41a, 41b and 41c is disposed corresponding to each of the second spiral inductors 42a, 42b and 42c. Further, according to the requirements of the design, every pair of the corresponding first spiral inductors 41a, 41b and 41c and second spiral inductors 42a, 42b and 42c may have the same interval, different intervals, or partially different intervals therebetween.

Figure 8A:
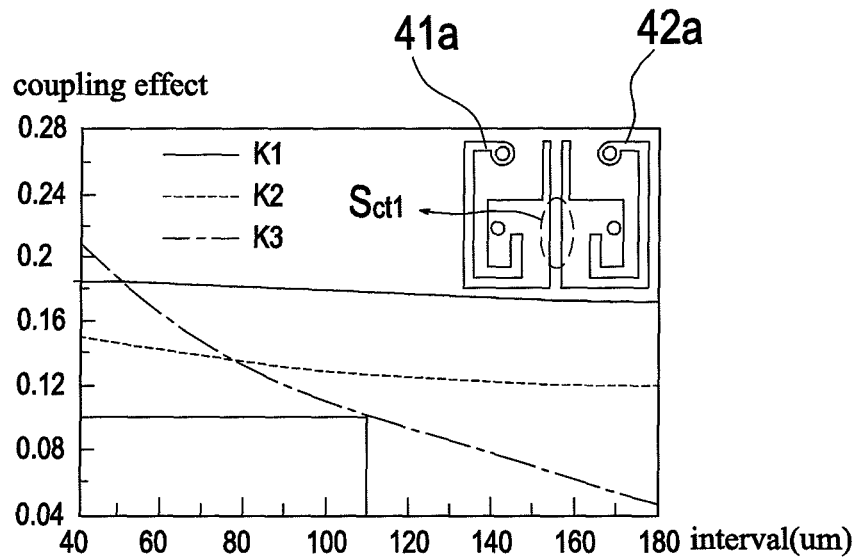
FIGS. 8A, 8B, and 8C are views illustrating the embodiment of a coupling value curve of the triple-band band pass filter according to the present invention.
Figure 8B:
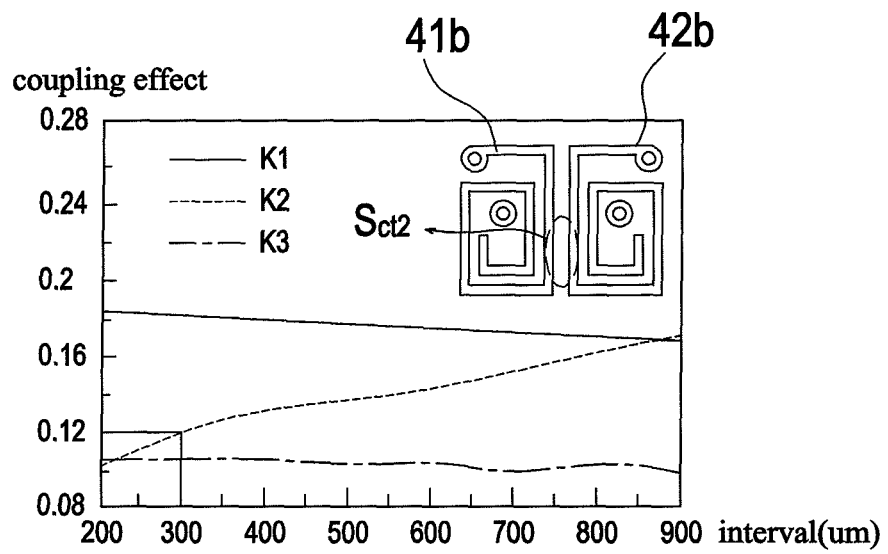
Figure 8C:
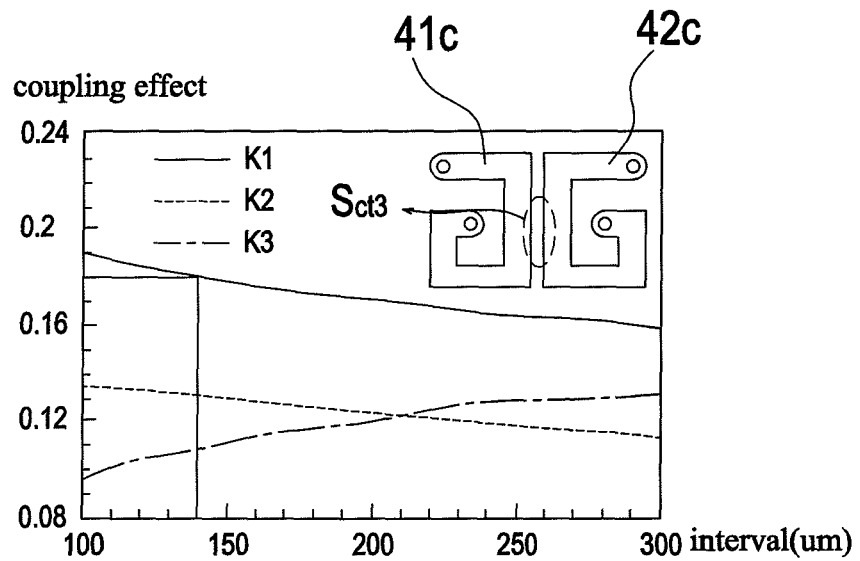

Please further refer to FIGS. 8A, 8B and 8C, which illustrate the embodiment of a coupling value curve of the triple-band band pass filter according to the present invention; and please also refer to FIGS. 5 to 7 for better understanding. In the present invention, the intervals between corresponding first spiral inductors 41a, 41b and 41c and second spiral inductors 42a, 42b and 42c may be similar to the settings illustrated in FIG. 3 and FIGS. 4A and 4B.

For example, no matter how a first interval Sct1 between the first spiral inductors 41a and the second spiral inductors 42a is adjusted, little change is made upon the coupling values k1 and k2 corresponding to this spiral inductor combination. When a second interval Sct2 between the first spiral inductors 41b and the second spiral inductors 42b is adjusted, little change is made upon the coupling value k1 corresponding to this spiral inductor combination. When a third interval Sct3 between the first spiral inductors 41c and the second spiral inductors 42c is adjusted, little change is made upon the coupling value k2 corresponding to this spiral inductor combination.

Assuming that the coupling value k1 that the triple-band band pass filter requires 40 is 0.18, the coupling value k2 that the triple-band band pass filter 40 requires is 0.12, and the coupling value k3 that the triple-band band pass filter requires 40 is 0.10. Firstly, the third interval Sct3 between the first spiral inductors 41c and the second spiral inductors 42c may be adjusted to be 140 um, thereby satisfying the requirement for making the coupling value k1 to be 0.18. Then, the first interval Sct1 between the first spiral inductors 41a and the second spiral inductors 42a is adjusted to be 110 um, thereby satisfying the requirement for making the coupling value k3 to be 0.10. Finally, the second interval Sct2 between the first spiral inductors 41b and the second spiral inductors 42b is adjusted to be 300 um, thereby satisfying the requirement for making the coupling value k2 to be 0.12. The requiring coupling value of the triple-band band pass filter may hereby satisfy design requirement.

In other words, when adjusting the intervals between each of the spiral inductors combinations, firstly, changes in coupling values of each spiral inductors combinations under the influence of electric field should be determined to find out the one with largest coupling value change. After that, adjustment may be made to the interval between the spiral inductors combination with largest coupling value change; and then, adjustment may be made to the interval between the spiral inductors combination with smaller coupling value change. By this means, a multi-band band pass filter with a required coupling value k and satisfies a frequency matching value Qe may be designed.

Figure 9:
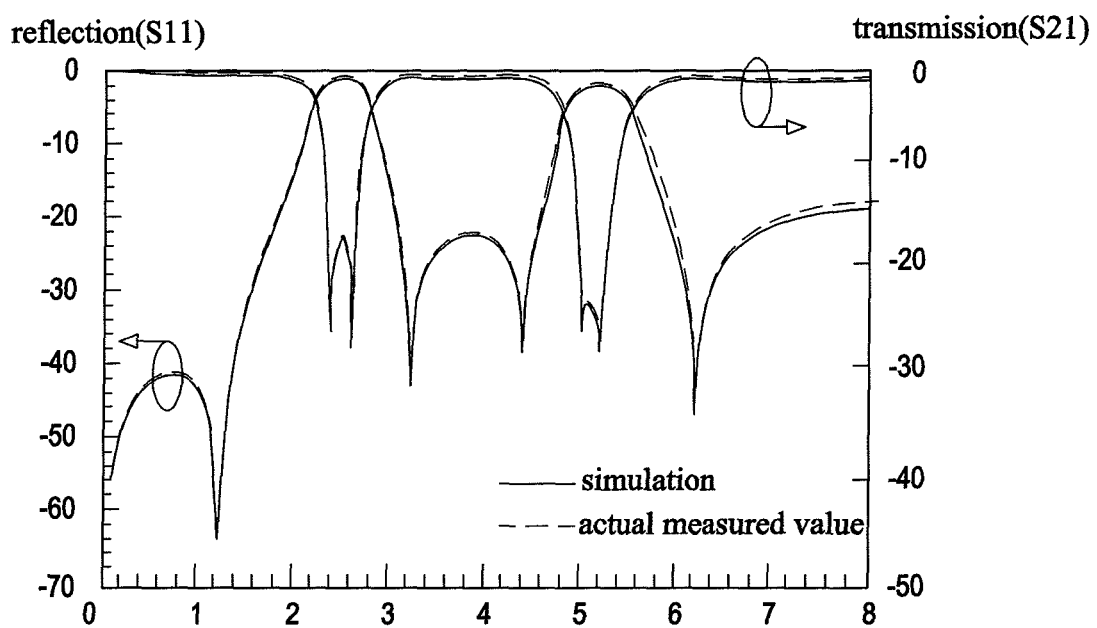
FIG. 9 is a view illustrating a frequency response of reflection (S11) and transmission (S21) of the dual-band band pass filter according to the embodiment of the present invention.

Please refer to FIG. 9, a view illustrating a frequency response of reflection (S11) and transmission (S21) of the dual-band band pass filter according to the embodiment of the present invention. As shown in FIG. 9, and further referring to FIGS. 1 to 4B, the dual-band band pass filter satisfies the design requirements of the two frequency response values, the coupling value k, and the frequency matching value Qe of each resonator.

Figure 10:
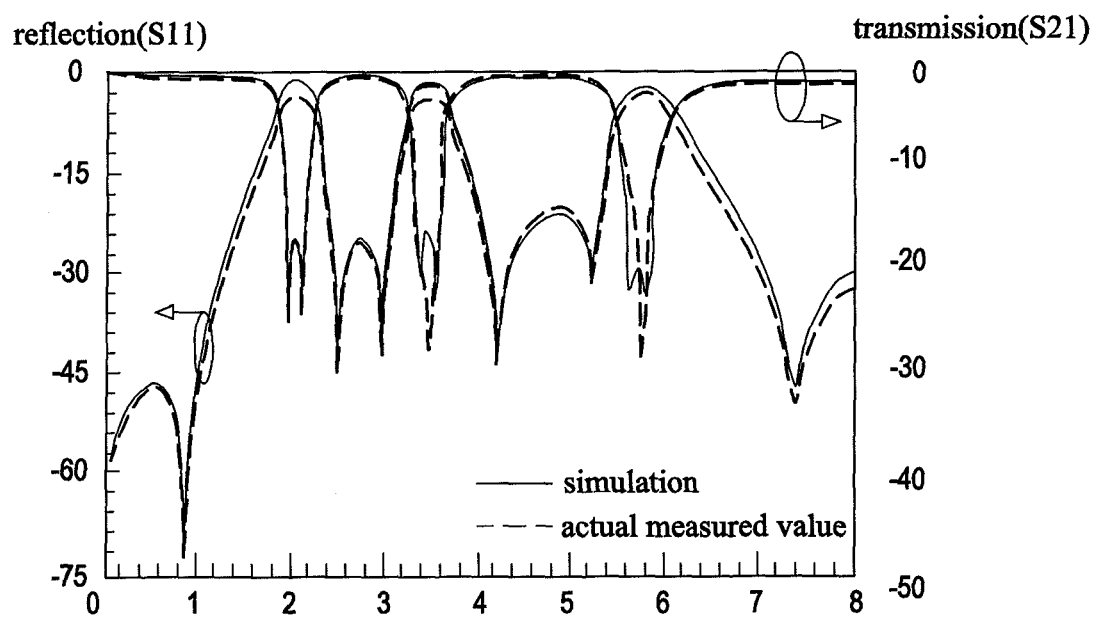
FIG. 10 is a view illustrating a frequency response of reflection (S11) and transmission (S21) of the triple-band band pass filter according to the embodiment of the present invention.

Please refer to FIG. 10, a view illustrating a frequency response of reflection (S11) and transmission (S21) of the triple-band band pass filter according to the embodiment of the present invention. As shown in FIG. 10, and further referring to FIGS. 5 to 9B, the triple-band band pass filter satisfies the design requirements of the three frequency response values, the coupling value k, and the frequency matching value Qe of each resonator.

The previous description of the preferred embodiment is provided to further describe the present invention, not intended to limit the present invention. Any modification apparent to those skilled in the art according to the disclosure within the scope will be construed as being included in the present invention.

What is claimed is:

1. A stacked LC resonator comprising:
   a flat metal base layer;
   a plurality of spiral inductors disposed layer-by-layer, parallel to the flat metal base layer;
   a plurality of dielectric layers, formed between the spiral inductors, and between the flat metal base layer and the spiral inductor corresponding to the flat metal base layer; and
   N conductive poles, the quantity of the plurality of spiral inductors is N for N>1, wherein each of the plurality of spiral inductors comprises a first end and a second end, and the Nth conductive pole is connected between the second end of the (N−1)th spiral inductor and the first end of the Nth spiral inductor,
   wherein the second end of the Nth spiral inductor is open-ended.

2. The stacked LC resonator of claim 1, wherein spirals of the spiral inductors are oriented in same, different, or partially-same, partially different directions.

3. The stacked LC resonator of claim 1, comprising a first conductive pole, wherein N=1 conductive poles, and the first conductive pole is connected to between the flat metal base layer and the first end of a first spiral inductor of the plurality of N spiral inductors.

4. The stacked LC resonator of claim 1, further comprising a second conductive pole, wherein N=2 conductive poles, and the second conductive pole is connected between the second end of a first spiral inductor and the first end of a second spiral inductor of the plurality of N spiral inductors.

5. The stacked LC resonator of claim 4, wherein the quantity of the plurality of spiral inductors N is two.

6. The stacked LC resonator of claim 1, further comprising a third conductive pole, wherein N=3 conductive poles, and the quantity of the plurality of N spiral inductors is at least three, and the third conductive pole is connected between the second end of a second spiral inductor of the plurality of N spiral inductors and the first end of a third spiral inductor of the plurality of N spiral inductors.

7. The stacked LC resonator of claim 6, wherein the quantity of the plurality of spiral inductors N is at least three, and the second end of the third spiral inductor is open-ended.

8. A band pass filter structure comprising:
   a coupled structure of the two stacked LC resonators, comprising:

a flat metal base layer;

a plurality of coupled spiral inductors disposed layer-by-layer, parallel to the flat metal base layer; and a plurality of coupled dielectric layers, formed between the coupled spiral inductors, and between the flat metal base layer and the coupled spiral inductor corresponding to the flat metal base layer;

wherein each of the plurality of coupled spiral inductor pairs comprises two spiral inductors that are disposed correspondingly to each other, wherein each of the coupled structure of the two stacked LC resonators has N spiral inductors and N conductive poles for N>1, and the Nth conductive pole is connected between the second end of the (N−1)th spiral inductor of the each of the coupled structure of the two stacked LC resonators and the first end of the Nth spiral inductor of the each of the coupled structure of the two stacked LC resonators, and the second end of the Nth spiral inductor of the each of the coupled structure of the two stacked LC resonators is open-ended.

9. The band pass filter of claim 8, wherein the intervals between each coupled spiral inductor pair are of same width, different widths, or partially-identical, partially-different widths.

* * * * *